(12) United States Patent
Arnoux et al.

(10) Patent No.: US 6,215,296 B1
(45) Date of Patent: Apr. 10, 2001

(54) ARRANGEMENT FOR THE MEASUREMENT OF ALTERNATING OR DIRECT CURRENT

(75) Inventors: Axel Arnoux; Claude Genter, both of Paris; Didier Piaud, Chaville, all of (FR)

(73) Assignee: Chauvin Arnoux, Paris (FR)

( * ) Notice: Subject to any disclaimer, the term of this patent is extended or adjusted under 35 U.S.C. 154(b) by 0 days.

(21) Appl. No.: 09/229,830

(22) Filed: Jan. 13, 1999

(30) Foreign Application Priority Data

Jan. 15, 1998 (FR) .................................................. 98 00377

(51) Int. Cl.$^7$ .................................................. G01R 33/00
(52) U.S. Cl. ........................................ 324/117 R; 324/127
(58) Field of Search ........................... 324/117 R, 117 H, 324/127

(56) References Cited

U.S. PATENT DOCUMENTS 5,459,395 * 10/1995 Berkcan ............................ 324/117 R
6,005,383 * 12/1999 Savary et al. ..................... 324/117 H

FOREIGN PATENT DOCUMENTS

WO9011529   10/1990   (WO) .

* cited by examiner

*Primary Examiner*—Safet Metjahic
*Assistant Examiner*—J Kerveros
(74) *Attorney, Agent, or Firm*—Leydig, Voit & Mayer, Ltd.

(57) ABSTRACT

An arrangement for measuring alternating or direct current based on the magnetic field generated by the flow of the current includes a sensor for sensing the magnetic field generated by the flow of the current, a measuring circuit for determining the current from the magnetic field, and a device for sensing an external parasitic magnetic field and producing a correction signal applied to the measuring circuit for accurate measurement of the current.

5 Claims, 2 Drawing Sheets

ARRANGEMENT FOR THE MEASUREMENT OF ALTERNATING OR DIRECT CURRENT

FIELD OF THE INVENTION

Figure 1:
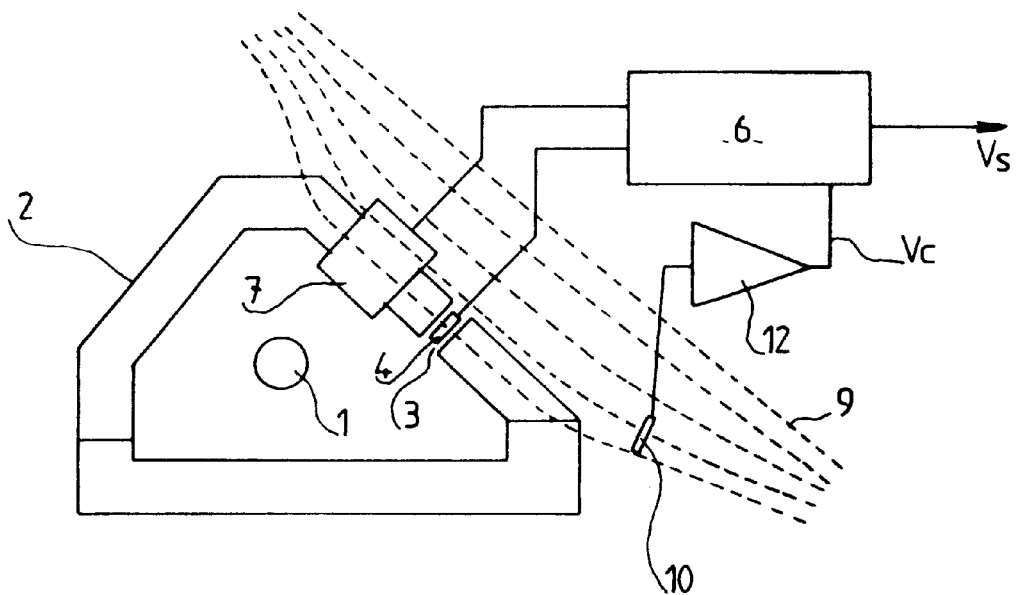

The invention relates to an alternating or direct current measuring arrangement for generating a magnetic field from the current to be measured, a device for sensing the generated magnetic field, and a measuring circuit which determines the current.

BACKGROUND

There are already known measuring arrangements which generally use a grip current tester or a torus which may or not be opened and which fully closes about a cable in which the current to be measured is flowing.

Now it is known that the presence of discontinuities in the magnetic circuit, as produced by an air gap, a winding, an opening of the grip current tester for tightly enclosing the cable, the insertion of the sensor or the like creates zones on torus which exhibit a greater sensitivity to magnetic fields of external origin, i.e., a parasitic field thereby altering or making false the measurement of the current.

The usual measures for decreasing these external influences consist either in reducing these discontinuities to the utmost or in modifying the geometry of the parts present in this sensitive zone or in adding a shield or screen in the vicinity of this zone.

These different measures for solving the problem caused by the discontinuities are the major inconveniences likely to change the design of the measuring equipment and of adding difficulties during its manufacture.

SUMMARY OF THE INVENTION

The object of the present invention is to provide a measuring arrangement which copes with the inconveniences of the state of the art which have just been stated.

To reach this goal, the arrangement according to the invention includes means for reducing the external influences comprising a device for sensing the parasitic field and a circuit for the correction of the external influences by applying a correction to the aforesaid measuring circuit.

According to one feature of the invention, when the parasitic field is a parasitic magnetic field, the device for sensing the parasitic field comprises at least one magnetic field sensor disposed in the vicinity of the zone sensitive to the parasitic magnetic field.

According to another feature of the invention, the correction circuit comprises means for sensing the measured parasitic field and for applying the measured parasitic field in reverse state at a predetermined point of the measuring circuit.

According to still another feature of the invention, a correction sensor is disposed at the same angle with respect to parasitic field lines as a measuring sensor with respect to the lines of a magnetic field to be measured.

According to still another feature of the invention, when the current to be measured is established by reducing to zero the magnetic field which generates it, a correction is applied to a current amplifier mounted in a circuit of a field annulment coil.

According to still another feature of the invention, when a current is established through measurement of the magnetic field generated by it, the correction is applied to the input of an operational amplifier mounted in a measuring circuit.

BRIEF DESCRIPTION OF THE DRAWINGS FIGURES

Figure 2:
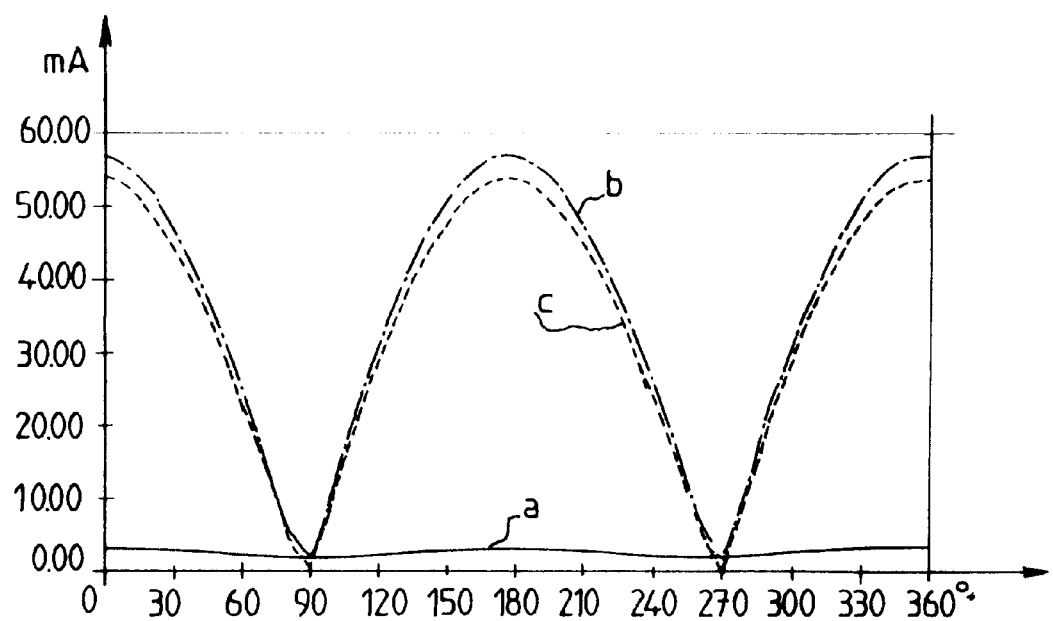
Figure 3:
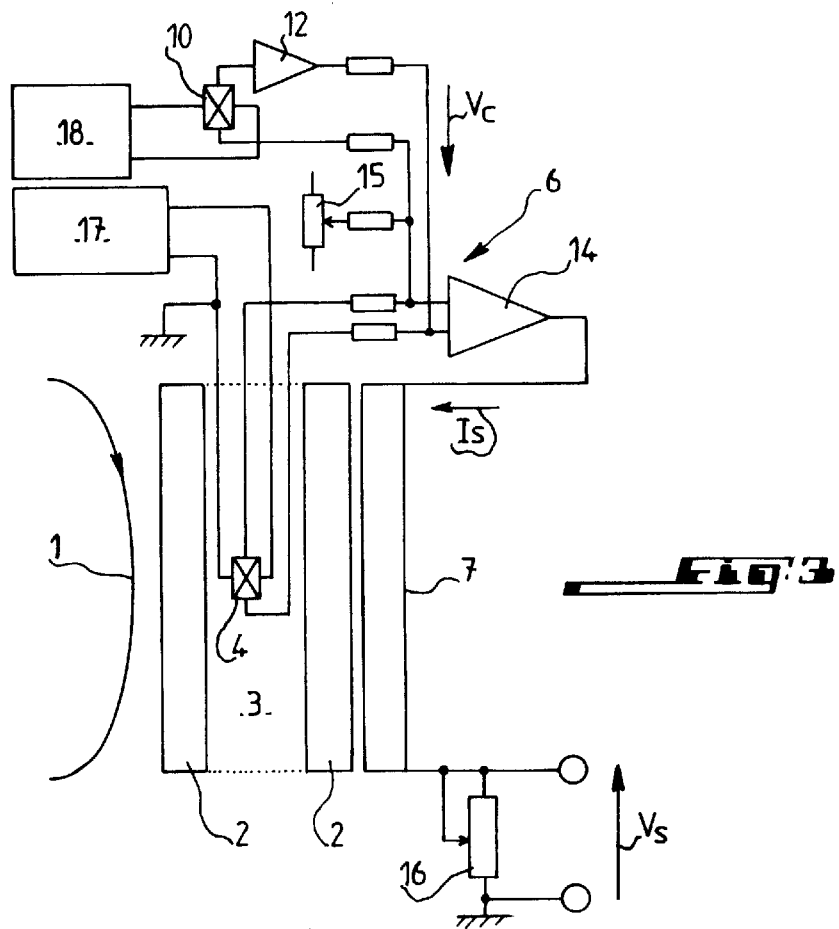
Figure 4:
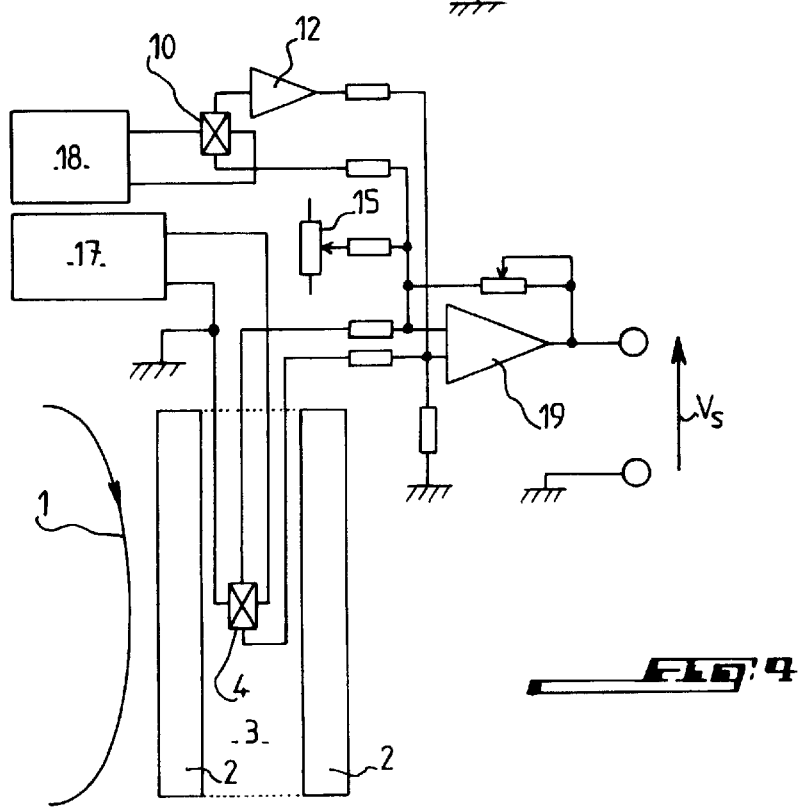

The invention will be better understood and further objects, features, details and advantages thereof will appear more clearly as the following explanatory description proceeds with reference to the attached diagrammatic drawings given by way of non limiting examples, illustrating two embodiments of the invention, and in which:

FIG. 1 is a block diagram of an arrangement for the measurement of alternating or direct current according to the present invention;

FIG. 2 illustrates, with the assistance of graphs, the effect of the arrangement according to the invention FIG. 3 shows, as a block diagram, an arrangement for the current measurement through annulment of the magnetic field, according to the present invention; and FIG. 4 shows, as a block diagram, an arrangement for measuring the current through measurement of the magnetic field, according to the present invention.

DETAILED DESCRIPTION

Referring to FIGS. 1 and 2, the principle of the structure of an arrangement according to the invention and the effect it produces will at first be described hereinafter.

In FIG. 1, the conductor in which flows the current to be measured carries the reference numeral 1. The arrangement for the measurement of this current comprises a magnetic torus 2 which surrounds the conductor 1 and is provided with an air gap 3 in which is mounted a sensor 4 for sensing the magnetic field generated by the current to be measured, in the magnetic torus 2. The sensor 4 produces an electric signal which is applied to an electric circuit 6 intended to produce a measurement signal Vs, representative of the current flowing in this conductor 1.

The measurement arrangement measures current by annulment of the generated magnetic field and comprises a coil 7 wound about the magnetic torus 2 and intended to produce the magnetic field inside of the torus, which annuls the magnetic field produced by the current to be measured flowing in the conductor 1. The coil is connected to the circuit 6.

The magnetic torus is exposed to a parasitic external magnetic field, the field lines of which are represented by interrupted lines 9. It is seen that the external field is deformed in the vicinity of the torus.

According to the invention, a magnetic field sensor 10 is disposed in the parasitic field in the vicinity of the zone sensitive to this field. As seen on the figure, the sensor 10 is disposed at the same angle with respect to the parasitic field lines 9 as the measuring sensor 4 with respect to the magnetic field generated by the current to be measured. In the case shown, the sensor 10 is placed substantially in perpendicular relation to the field lines 9.

The sensor 10 is connected to an electronic circuit 12 for amplifying the signal produced in order that the amplified signal be applied as a correction signal Vc to the measuring circuit 6.

FIG. 2 illustrates, with three curves, the effect of the correction device by showing the residual current measured in the presence of a parasitic external uniform field in accordance with the angle between a grip current tester and the outside field. The curve a shows the current represented by the value Vs after correction, the curve b shows this value Vs, without any correction, and the curve c indicates the correction value Vc.

FIG. 3 shows with more details of the arrangement of FIG. 1. In this figure are used the same reference numerals as in FIG. 1 for components which are identical or similar in both cases. It is seen in particular that the signal Vc, after having been amplified at 12 is applied to both inputs of a current amplifier 14 which forms part of the measuring circuit 6 of FIG. 1. The arrangement of FIG. 3 provides a potentiometer 15 for the zero adjustment of one of the inputs of the current amplifier 14. The output of the latter is connected to the coil 7 and the measurement signal Vs is available as a voltage across the terminals of an adjustable resistor 16 mounted in series with the coil 7. The reference numerals 17 and 18 designate the feeds with electric energy of the measuring sensor 4 and of the sensor for the detection of the parasitic field 10, respectively.

FIG. 4 illustrates the use of the invention in an arrangement for current measurement through measurement of the magnetic field. In this case the correction value Vc is applied to both inputs of an operational amplifier 19 and the measurement signal Vs is produced at the output of this amplifier.

As to the operation of the arrangement according to the invention, it should be pointed out that the output of the parasitic field sensor 10 after having been amplified will be added in opposition to minimize the influence exerted by this parasitic field. It should be pointed out that the response of the sensor 10 for a circular rotation of the outer field in the three axes x, y and z should correspond to that of the measuring unit under the same conditions. For example with a sensor of the Hall type, two lobes in opposition by 180° will be obtained. It would be necessary that the response of the correction be in phase and have the same amplitude. The opposition of both signals will cancel the disturbing effect of the external field.

It should be noted that the principle of correction of the external field influence, which has just been described, may also be used for correcting remanence and measurement drift as a function of ambient temperature.

What is claimed is:

1. An arrangement for measurement of alternating current or direct current comprising:
   a device for sensing a magnetic field generated in response to a flow of a current,
   a measuring circuit for determining the current from the magnetic field, and
   means for reducing influence of an external parasitic magnetic field in a measurement zone where the magnetic field is sensed, the means comprising:
   a device for sensing the parasitic magnetic field and a circuit responsive to the parasitic magnetic field sensed for establishing a correction signal correcting for the parasitic magnetic field and applied to the measuring circuit wherein the device for sensing the parasitic magnetic field is disposed in the parasitic magnetic field at an identical angle with respect to field lines of the parasitic magnetic field as is the device for sensing the magnetic field with respect to field lines of the magnetic field.

2. The arrangement according to claim 1, wherein the device for sensing the parasitic magnetic field comprises at least one magnetic field sensor disposed proximate a zone sensitive to the parasitic magnetic field.

3. The arrangement according to claim 2, wherein the device for sensing the magnetic field comprises a magnetic torus surrounding a conductor in which the current flows and comprising an air gap in which is disposed the device for sensing the magnetic field.

4. The current measuring arrangement according to claim 3, comprising an annulment coil surrounding part of the torus and a current amplifier connected to the annulment coil and receiving the correction signal.

5. The current measuring arrangement according to claim 3, comprising an amplifier receiving the correction signal and producing an output signal indicative of the current.

* * * * *